(12) United States Patent
Yin et al.

(10) Patent No.: US 7,888,972 B2
(45) Date of Patent: Feb. 15, 2011

(54) LOGIC CIRCUITS, INVERTER DEVICES AND METHODS OF OPERATING THE SAME

(75) Inventors: Huaxiang Yin, Yongin-si (KR);
Youngsoo Park, Yongin-si (KR);
Jaechul Park, Seoul (KR); Sunil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/318,727

(22) Filed: Jan. 7, 2009

(65) Prior Publication Data
US 2009/0315590 A1 Dec. 24, 2009

(30) Foreign Application Priority Data
Jun. 18, 2008 (KR) .................... 10-2008-0057488

(51) Int. Cl.
*H03K 19/20* (2006.01)
*H03K 19/094* (2006.01)

(52) U.S. Cl. ................. 326/119; 326/112; 326/88
(58) Field of Classification Search ............. 326/119, 326/120, 112, 83, 86, 88
See application file for complete search history.

(56) References Cited

U.S. PATENT DOCUMENTS

| 4,449,066 | A * | 5/1984 | Aoyama et al. | 326/88 |
| 6,953,947 | B2 * | 10/2005 | Son et al. | 257/40 |
| 7,408,386 | B2 * | 8/2008 | Yu | 326/88 |
| 2007/0188196 | A1 * | 8/2007 | Yu | 326/88 |

* cited by examiner

*Primary Examiner*—Daniel D Chang
(74) *Attorney, Agent, or Firm*—Harness, Dickey & Pierce, P.L.C.

(57) ABSTRACT

An inverter device includes at least a first transistor connected between a power source node and ground. The first transistor includes a first gate and a first terminal that are internally capacitive-coupled to control a boost voltage at a boost node. The first terminal is one of a first source and a first drain of the first transistor.

21 Claims, 7 Drawing Sheets
(3 of 7 Drawing Sheet(s) Filed in Color)

LOGIC CIRCUITS, INVERTER DEVICES AND METHODS OF OPERATING THE SAME

PRIORITY STATEMENT

This non-provisional U.S. patent application claims priority under 35 U.S.C. §119 to Korean Patent Application No. 10-2008-0057488, filed on Jun. 18, 2008, in the Korean Intellectual Property Office, the entire contents of which is incorporated herein by reference.

BACKGROUND

DESCRIPTION OF THE RELATED ART

Conventional inverter devices are used in logic circuits to invert and output a phase of an input voltage. Conventional inverter devices (circuits) include only enhancement mode transistors, or a combination of enhancement-mode transistors and depletion mode transistors.

FIG. 1 is a circuit diagram illustrating a conventional enhancement/enhancement (E/E)-mode inverter device.

Referring to FIG. 1, a first transistor T1 and a second transistor T2 are connected between a power voltage $V_{dd}$ and ground GND to form an inverter. An input voltage $V_i$ is applied to the second transistor T2. The power voltage $V_{dd}$ is applied to an input terminal and the gate of the first transistor T1. An output voltage $V_o$ is output between the first transistor T1 and the second transistor T2. In this example, both the first transistor T1 and the second transistor T2 are enhancement-mode transistors.

In such conventional E/E-mode inverter devices, the first transistor T1 functions as a load resistance because the first transistor T1 is generally in an ON state. Accordingly, the output voltage $V_o$ may be determined by a resistance ratio of the first and second transistors T1 and T2. As a result, a high level output (e.g., logic high or 'H') is not equal to the power voltage $V_{dd}$, but is reduced to a value $(V_{dd}-V_{th1})$ obtained by subtracting a threshold voltage $V_{th1}$ of the first transistor T1 from the power voltage $V_{dd}$. The reduction in the output may gradually reduce the output pulse amplitude in a chain structure of conventional E/E-mode inverter devices, as will be described later with regard to FIG. 11.

FIG. 2 is a circuit diagram illustrating a conventional enhancement/depletion (E/D)-mode inverter device.

Referring to FIG. 2, a third transistor T3 and a fourth transistor T4 are connected between a power voltage $V_{dd}$ and ground GND to form an inverter. The third transistor T3 is a depletion-mode transistor, whereas the fourth transistor T4 is an enhancement-mode transistor.

In such conventional E/D-mode inverter devices, a high level output (e.g., logic high or 'H') may be closer (e.g., nearly or substantially) equal to the power voltage $V_{dd}$. But, the conventional E/D-mode inverter device has a relatively long signal propagation time, as will be described with reference to FIG. 9.

SUMMARY

Example embodiments relate to semiconductor devices, for example, logic circuits, inverter devices and methods of operating the same. At least one example embodiment provides an inverter device in which an internal capacitive-coupling between a source/drain and a gate of a transistor enables a boost voltage at a boost node to be controlled without the need for a separate capacitor.

At least one example embodiment provides an inverter device. According to at least one example embodiment, the inverter device may include a first transistor, a second transistor, and a third transistor. The first transistor may include a first gate, a first source and a first drain. A power voltage may be applied to the first drain and an output voltage may be output from the first source. The second transistor may include a second gate, a second source, and a second drain. An input voltage may be applied to the second gate and the second drain may be connected to the first source so as to output the output voltage. The third transistor may include a third gate, a third source, and a third drain. A power voltage may be applied to the third gate and the third drain, and the third source may be connected to the first gate. The first gate and the first source may be internally capacitive-coupled in the first transistor to control a boost voltage at a boost node. The inverter device need not use a separate capacitor.

According to at least some example embodiments, the first gate and the first source may be internally capacitive-coupled by a first parasitic capacitance due to an overlap between the first gate and the first source. The third gate and the third source may be internally capacitive-coupled by a second parasitic capacitance due to an overlap between the third gate and the third source. The first transistor and/or the third transistor may be a thin film transistor (TFT), for example, a thin film transistor having an inverted structure. The first transistor, the second transistor and the third transistor may be enhancement-mode transistors.

At least one other example embodiment provides an inverter device. The inverter device may include a load transistor, an input transistor, and a pre-charge transistor. The load transistor may have a first gate, a first source, and a first drain. A power voltage may be applied to the first drain and an output voltage may be output from the first source. The input transistor may have a second gate, a second source, and a second drain. An input voltage may be applied to the second gate, the second drain may be connected to the first source so as to output the output voltage, and the second source may be connected to ground. The pre-charge transistor may have a third gate, a third source, and a third drain. The power voltage may be applied to the third gate and the third drain, and the third source may be connected to the first gate. The first gate and the first source may be internally capacitive-coupled to control a boost voltage at a boost node without using a separate capacitor. The first gate and the first source may be internally capacitive-coupled by a first parasitic capacitance formed by an overlap between the first gate and the first source.

At least one other example embodiment provides a method of operating an inverter device. The method may comprise: controlling the size of a boost voltage induced on the first gate of the first transistor by a first parasitic capacitance formed by an overlap between the first gate and the first source.

According to at least some example embodiments, the size of the boost voltage may also be controlled by a second parasitic capacitance by an overlap between the third gate and the third source. The first parasitic capacitance and/or the capacitance of the third capacitor may be controlled by an overlap between the first gate and the first source. The overlap between the first gate and the first source may be controlled by an overlapping length between the first gate and the first source and/or a channel width of the first transistor.

At least one other example embodiment provides an inverter device. The inverter device may include a plurality of transistors connected between a power source node and ground. At least one of the plurality of transistors may include a gate and a terminal or impurity region that are internally capacitive-coupled to control a boost voltage at a boost node. The inverter device may control the boost voltage at the boost node without using a separate capacitor. The terminal may be one of a source and a drain of the at least one transistor.

At least one example embodiment provides a logic circuit. The logic circuit may include at least one transistor connected between a power source node and ground. The at least one transistor may include a gate and a terminal or impurity region that are internally capacitive-coupled to control a boost voltage at a boost node. The logic circuit may control the boost voltage at the boost node without using a separate capacitor. The terminal may be one of a source and a drain of the at least one transistor. The logic circuit may be an inverter or other logic device.

According to at least some example embodiments, the gate and the terminal may be internally capacitive-coupled via a parasitic capacitance. The parasitic capacitance may be provided by an overlap between the terminal and the gate. Two of the plurality of transistors may include a gate and a terminal. The gate and terminal of each of the two transistors may be internally capacitive-coupled with one another.

According to at least some example embodiments, a size of a boost voltage may be controlled by a parasitic capacitance formed by an overlap between the gate and the terminal. The boost voltage may be induced on the gate of the at least one transistor. The parasitic capacitance may be controlled by an overlapping area between the gate and the terminal. The overlapping area between the gate and the terminal may be controlled by an overlapping length between the gate and the terminal. Alternatively, the overlapping area between the gate and the terminal may be controlled by a channel width of the at least one transistor.

At least one example embodiment provides an inverter device. The inverter device may include at least one transistor and a means for controlling the boost voltage at a boost node. The at least one transistor may be connected between a power source node and ground. The means for controlling the boost voltage may be internal to the at least one transistor. The inverter device may control the boost voltage at the boost node without using a separate capacitor. The means for controlling the boost voltage may be an internal capacitive coupling between a terminal and the gate of the at least one transistor.

At least one other example embodiment provides inverter device. According to at least this example embodiment, at least a first transistor may be connected between a power source node and ground. The first transistor may include a first gate and a first terminal that are internally capacitive-coupled to control a boost voltage at a boost node. The first terminal may be one of a first source and a first drain of the first transistor. The boost voltage may be controlled without using a separate capacitor.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The present invention will become more apparent by describing in detail example embodiments thereof with reference to the attached drawings in which.

DETAILED DESCRIPTION OF EXAMPLE EMBODIMENTS

Figure 1:
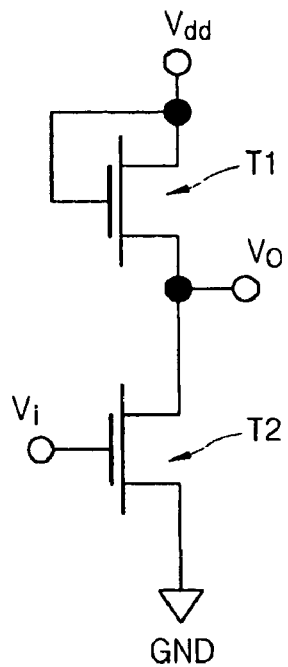
FIG. 1 is a circuit diagram illustrating a conventional enhancement/enhancement (E/E)-mode inverter device.

Various example embodiments will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
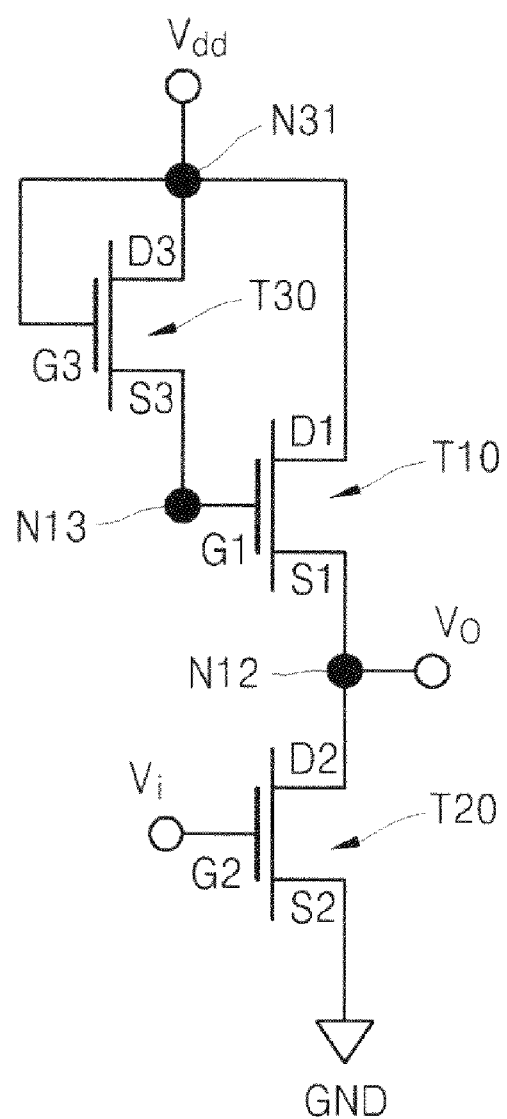
FIG. 3 is a circuit diagram illustrating an inverter device according to an example embodiment.
Figure 4:
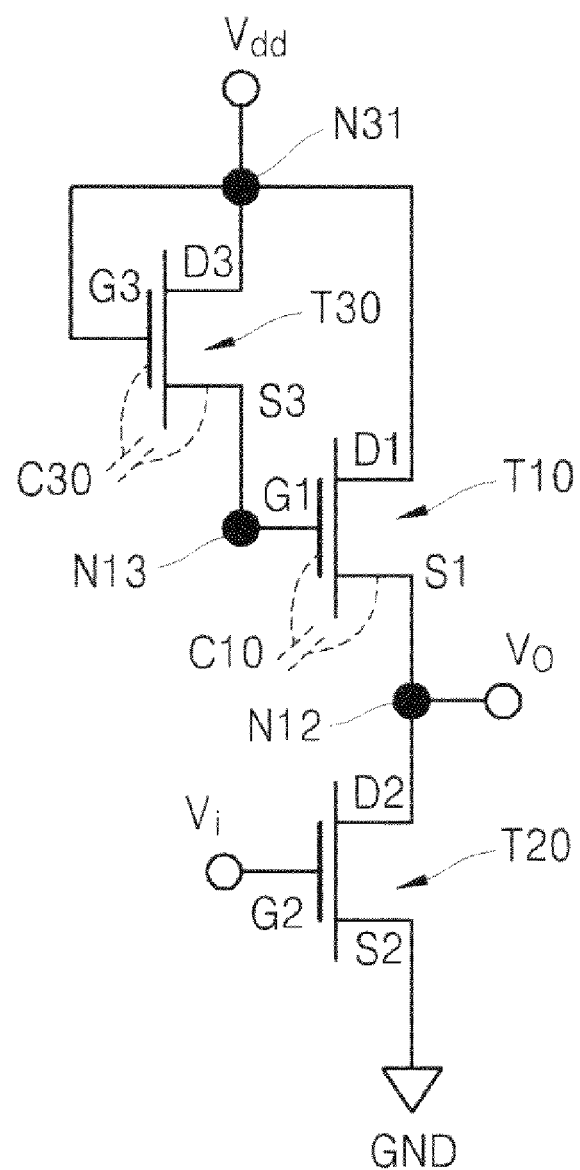
FIG. 4 is circuit diagram for explaining example operation of the inverter device of FIG. 3.

FIG. 3 is a circuit diagram illustrating an inverter device according to an example embodiment. FIG. 4 is circuit diagram for explaining example operation of the inverter device of FIG. 3.

Referring to FIG. 3, an inverter device may include a plurality of transistors, for example, a first transistor T10, a second transistor T20, and a third transistor T30. The first transistor T10 and the third transistor T30 may be coupled between a power source node N31 and an output node N12. The second transistor T20 may be coupled between the output node N12 and ground GND. A power voltage $V_{dd}$ may be applied through the power source node N31, and an output voltage $V_o$ may be output through the output node N12. The first transistor T10, the second transistor T20, and the third transistor T30 may be referred to as a load transistor, an input transistor, and a pre-charge transistor, respectively.

Still referring to FIG. 3, the first transistor T10 may have a first drain D1 connected to the power source node N31 and a first source S1 connected to the output node N12. A first gate G1 of the first transistor T10 may be connected to a boost node N13.

The second transistor T20 may include a second gate G2 connected to an input voltage $V_i$, a second drain D2 connected to the output node N12, and a second source S2 connected to ground GND.

The third transistor T30 may include a third gate G3 and a third drain D3 connected to the power source node N31. A third source S3 of the third transistor T30 may be connected to the boost node N13.

As discussed herein, sources and drains of transistors may be collectively referred to as impurity regions or terminals.

According to at least one example embodiment, each of the first, second, and third transistors T10, T20, and T30 may be an N-type enhancement-mode metal oxide semiconductor (MOS) transistor, rather than a depletion-mode transistor. Generally, an enhancement-mode transistor is in an OFF state unless a voltage (e.g., +5V) is applied to the gate electrode, whereas a depletion-mode transistor is in an ON state without applying a voltage to the gate electrode.

In example operation, the power voltage $V_{dd}$ may be applied to the first drain D1, the third drain D3, and the third gate G3 through the power source node N31. An input voltage $V_i$ may be applied to the second gate G2. As noted above, the third source S3 of the third transistor T30 may be connected to the first gate G1 of the first transistor T10 through a boost node N13. The first source S1 and the second drain D2 may be connected to each other through the output node N12. The output voltage $V_o$ may be output from the first source S1 or the second drain D2 through the output node N12. The second source S2 may be connected to the ground GND.

Inverter devices and/or logic circuits, according to at least this example embodiment, need not include a separate capacitor between the boost node N13 and the output node N12 to control the boost voltage at the boost node N13. Instead, the first gate G1 and the first source S1 of the first transistor T10 may be internally capacitive-coupled. The capacitive-coupling between the first gate G1 and the first source S1 suppresses attenuation of the power voltage $V_{dd}$ between the power supply node N31 and the output node N12.

For example, as illustrated in FIG. 4, the first gate G1 and the first source S1 may be capacitive-coupled by a first parasitic capacitance C10 formed by an overlap between the first gate G1 and the first source S1. The first parasitic capacitance C10 is illustrated as a dotted line in FIG. 4 to show that the first parasitic capacitance C10 is internal to the first transistor T10 and that no additional, separate capacitor component is required to control the boost voltage. Thus, this parasitic capacitance may be distinguished from a capacitance of a capacitor, which is separately provided. The boost node N13 and the output node N12 may be capacitive-coupled by the first parasitic capacitance C10 to suppress any decrease in the power voltage $V_{dd}$ between the power supply node N31 and the output node N12.

Alternatively, or in combination with the capacitive-coupling within the transistor T10, the third gate G3 and the third source S3 may be internally capacitive-coupled in the third transistor T30. For example, as illustrated in FIG. 4, the third gate G3 and the third source S3 may be capacitive-coupled by a second parasitic capacitance C30 formed by an overlap between the third gate G3 and the third source S3. Again, the second parasitic capacitance C30 may be distinguished from a capacitance of a capacitor, which is separately provided, in that the second parasitic capacitance C30 is internal to the third transistor T30; no additional capacitor component is required to control the boost voltage. The power source node N31 and the boost node N13 may be capacitive-coupled by the second parasitic capacitance C30. The internal capacitive coupling within a transistor (e.g., the first transistor T10 and/or the third transistor T30) may be referred to as a means for controlling a boost voltage at a boost node.

Referring to FIG. 4, when the input voltage $V_i$ is at a high level (e.g., logic high or 'H'), the second transistor T20 turns ON. In this case, the output node N12 and the ground GND are connected to each other, and the output voltage $V_o$ may be pulled down to a low level (e.g., logic low or 'L', opposite to the high level of the input voltage $V_i$).

On the other hand, when the input voltage $V_i$ is at a low level, the second transistor T20 turns OFF. Thus, the output node N12 and the ground GND may be electrically separated from each other. Because the power voltage $V_{dd}$ is at a high level, the third transistor T30 turns ON and the boost node N13 charges. After the boost node N13 is charged by a value $(V_{dd}-V_{th30})$ obtained by subtracting a threshold voltage $V_{th30}$ of the third transistor T30 from the power voltage $V_{dd}$, the third transistor T30 turns OFF. As a result, the boost node N13 floats.

As the boost node N13 is being charged, the first transistor T10 turns ON and the voltage of the output node N12 increases. As the voltage of the output node N12 increases, the voltage of the boost node N13 may increase by the first parasitic capacitance C10. Thus, the voltage applied to the first gate G1 may increase, and the output voltage $V_o$ may increase. For example, the output voltage $V_o$ may be greater than a value $V_{dd}-V_{th10}$ obtained by subtracting a threshold voltage $V_{th10}$ of the first transistor T10 from the power voltage $V_{dd}$. In an ideal example, $V_o$ may be similar or substantially similar to (e.g., the same or substantially the same as) the power voltage $V_{dd}$. The output voltage $V_o$ may increase by the first parasitic capacitance C10 without using an additional, separate capacitor.

When the first parasitic capacitance C10 and the second parasitic capacitance C30 coexist, a boost voltage $\Delta V$ at the boost node N13 may be calculated using Equation (1) by combining the first parasitic capacitance C10 and the second parasitic capacitance C30.

$$\Delta V = V_{dd} * (C10/(C10+C30)) \qquad (1)$$

The first parasitic capacitance C10 may be controlled by controlling an overlap between the first gate G1 and the first source S1, and the second parasitic capacitance C30 may be controlled by controlling an overlap between the third gate G3 and the third source S3. Accordingly, Equation (1) may be rewritten as Equation (2):

$$\Delta V = V_{dd} * (W10*L10/(W10*L10+W30*L30)) \qquad (2).$$

In Equation (2), L10 is an overlapping length between the first gate G1 and the first source S1, and L30 is an overlapping length between the third gate G3 and the third source S3. Width W10 denotes a channel width of the first transistor T10, and width W30 denotes a channel width of the third transistor T30. In this example, it is assumed that a dielectric constant between the first gate G1 and the first source S1 and a dielectric constant between the third gate G3 and the third source S3 are equal or substantially equal, but example embodiments are not limited thereto.

According to the above Equations (1) and (2), the greater the first parasitic capacitance C10 and the less the second parasitic capacitance C30, the greater the boost voltage $\Delta V$. Further, the greater an overlapping length L10 between the first gate G1 and the first source S1 and/or the less the channel width W10 of the first transistor T10, the greater the boost voltage $\Delta V$. The greater an overlapping length L30 between the third gate G3 and the first source S3 and/or the less the channel width W30 of the third transistor T30, the greater the boost voltage $\Delta V$.

Figure 5:
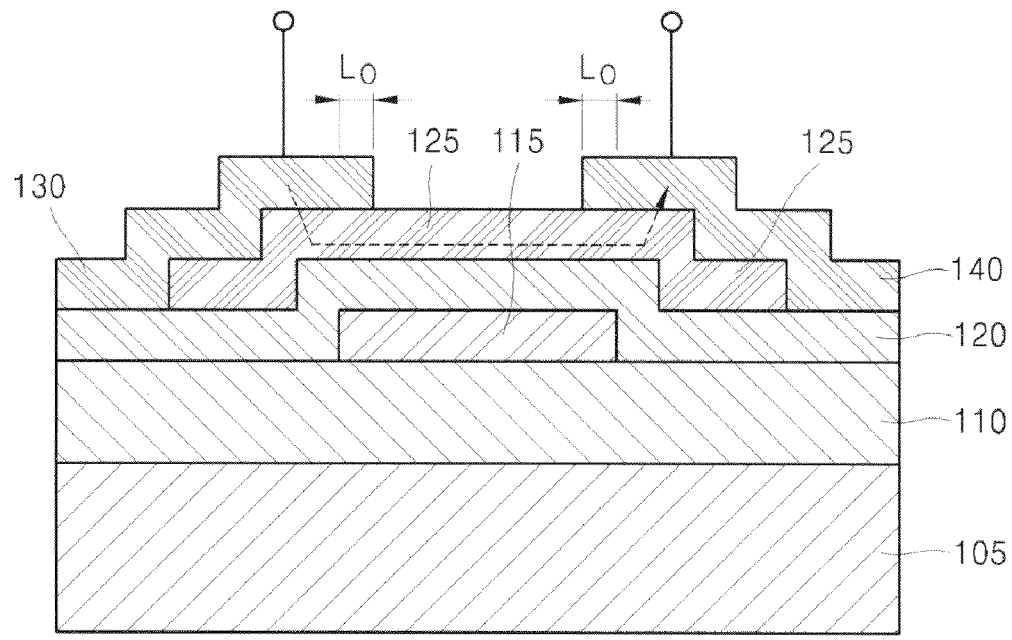
FIGS. 5 and 6 are cross-sectional views illustrating transistors of the inverter device of FIG. 3.
Figure 6:
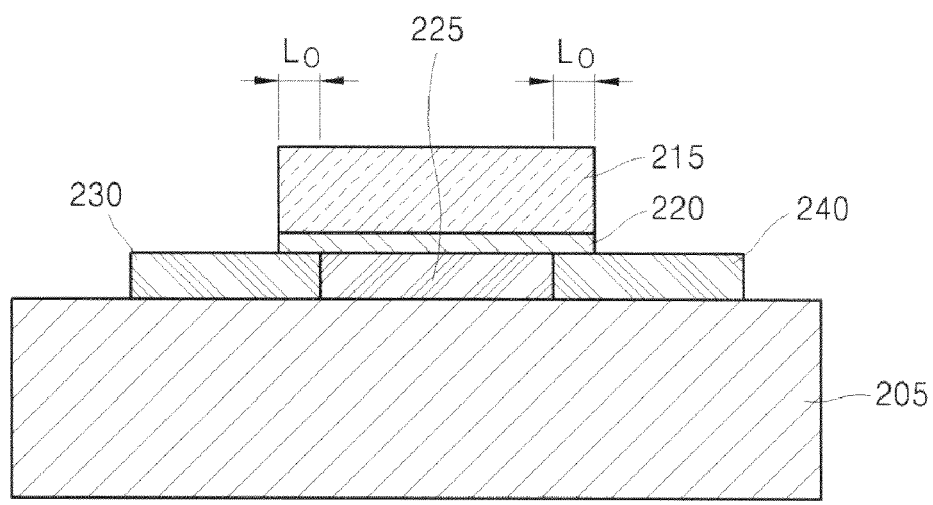

The first parasitic capacitance C10 and the second parasitic capacitance C30 may be controlled more easily in a thin film transistor (TFT) as compared to in a bulk substrate. FIGS. 5 and 6 are cross-sectional views illustrating transistors of the inverter device of FIG. 3. Each of the transistors T10, T20, and/or T30 may have the structure of the transistor shown in FIG. 5 or FIG. 6.

Referring to FIG. 5, for example, an insulating layer 110 may be interposed between a substrate 105 and a bottom gate electrode 115. A gate insulating layer 120 may be formed on the insulating layer 110 to cover the bottom gate electrode 115. A channel layer 125 may be formed on the gate insulating layer 120. A source electrode 130 and a drain electrode 140 may be formed on the channel layer 125. The source electrode 130 and the drain electrode 140 may be spaced apart from each other. Such structure may be called an inverted (or bottom-gate) structure because the channel layer 125, the source electrode 130, and the drain electrode 140 are stacked on the bottom gate electrode 115.

If one or more of the transistors T10, T20 and/or T30 have the structure shown in FIG. 5, the bottom gate electrode 115 may correspond to the first, second, or third gate G1, G2, or G3 of FIG. 3. Moreover, the source electrode 130 may correspond to the first, second, or third source S1, S2, or S3 of FIG. 3, and the drain electrode 140 may correspond to the first, second, or third drain D1, D2, or D3 of FIG. 3.

The channel layer 125 may include a semiconductor oxide such as, for example, zinc oxide (ZnO), tin oxide ($SnO_2$), indium-tin oxide (ITO), indium-zinc oxide (IZO), copper oxide ($Cu_2O$), nickel oxide (NiO), titanium oxide ($TiO_2$), (aluminium, gallium, indium)-doped zinc oxide (ZnO), (nitride, phosphorus, arsenic)-doped zinc oxide (ZnO), amorphous-GIZO($Ga_2O_3$—$In_2O_3$—ZnO), HIZO ($HfO_2$—$In_2O_3$—ZnO), CIZO (CrInZnO), or the like. As another example, the channel layer 125 may include amorphous-silicon, poly-silicon, germanium (Ge), or polymer.

An overlapping length $L_o$ between the bottom gate electrode 115 and the source electrode 130 or between the bottom gate electrode 115 and the drain electrode 140 may be controlled more easily by controlling the location of the source electrode 130 or the drain electrode 140 on the channel layer 125.

Referring to FIG. 6, a channel layer 225 may be formed on a substrate 205, and the channel layer 225 may be interposed between a source electrode 230 and a drain electrode 240. A gate insulating layer 220 may be formed on the channel layer 225, and an upper gate electrode 215 may be formed on the gate insulating layer 220 and may cover portions (e.g., edge portions) of the source electrode 230 and the drain electrode 240. This structure may be compared to the structure described with reference to FIG. 5 in that an upper gate electrode 215 is formed on the channel layer 225, the source electrode 230, and the drain electrode 240. The structure of the transistor shown in FIG. 6 may be referred to as a top-gate type structure.

If one or more of the transistors T10, T20 and/or T30 have the structure shown in FIG. 6, the upper gate electrode 215 may correspond to the first, second, or third gate G1, G2, or G3 of FIG. 3. Moreover, the source electrode 230 may correspond to the first, second, or third source S1, S2, or S3 of FIG. 3, and the drain electrode 240 may correspond to the first, second, or third drain D1, D2, or D3 of FIG. 3.

Although each of FIGS. 5 and 6 illustrate both the source region and the drain regions overlapping the gate, this need not be the case. One or more of the source and drain regions may overlap the gate. Moreover, example embodiments may include combinations of the transistors structured as shown in FIGS. 5 and 6.

An overlapping length $L_o$ between the upper gate electrode 215 and the source electrode 230 or between the upper gate electrode 215 and the drain electrode 240 may be controlled by controlling the length of the upper gate electrode 215 or controlling the location of the source electrode 230 or the drain electrode 240 on the substrate 205. Considering that the length of the upper gate electrode 215 is often restricted relatively strictly, controlling the location of the source electrode 230 or the drain electrode 240 on the substrate 205, rather than controlling the length of the upper gate electrode 215, may be used more often.

However, alignment of the upper gate electrode 215 should be considered again after controlling the location of the source electrode 230 or the drain electrode 240 such that the upper gate electrode 215 overlaps the source and drain electrodes 230 and 240.

Figure 7:
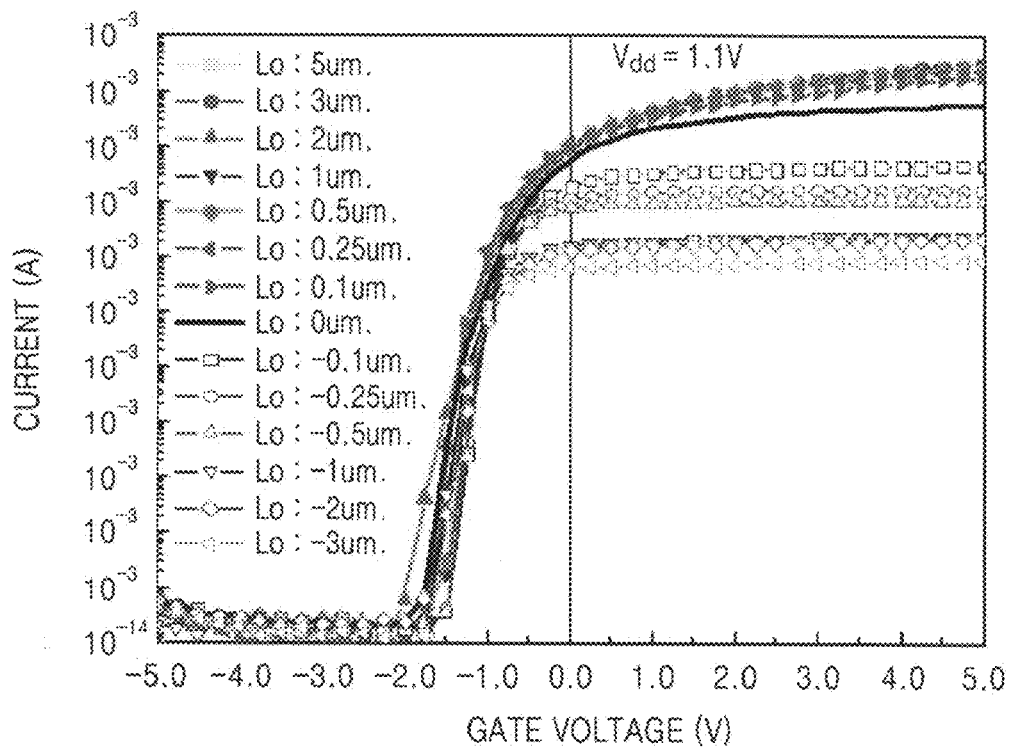
FIG. 7 is a graph illustrating a gate voltage-current property obtained by an experiment with the inverter device of FIG. 3.
Figure 8:
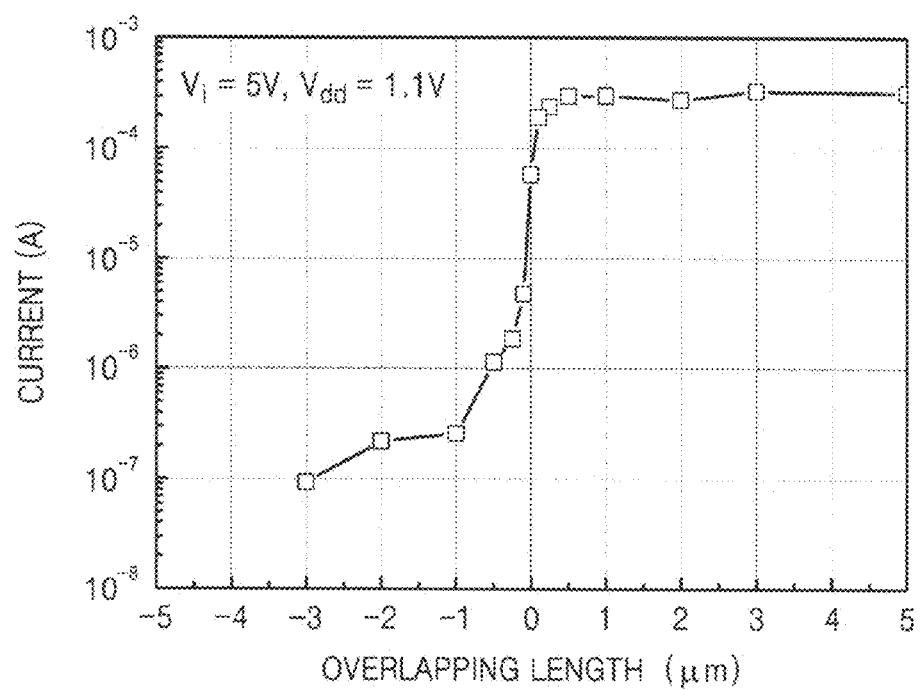
FIG. 8 is a graph illustrating an overlapping length-current property obtained from the result of FIG. 7.

FIG. 7 is a graph illustrating a gate voltage-current property obtained by an experiment with the inverter device of FIG. 3. FIG. 8 is a graph illustrating an overlapping length-current property obtained from the results shown in FIG. 7. FIGS. 7 and 8 illustrate results obtained using the thin film transistor of FIG. 5. In these examples, an overlapping length $L_o$ represents the overlapping length between the first gate G1 and the first source S1 of FIG. 3.

Referring to FIGS. 7 and 8, as the overlapping length $L_o$ increases, a value of a saturation current increases. In this example, the current is output from the output node N12 of FIG. 3. The increase of the output current denotes increase of the output voltage $V_o$ of FIG. 3, and consequently denotes an increase in operating speed. Accordingly, by increasing the overlapping length $L_o$, the output voltage $V_o$ and the operating speed of the resultant inverter circuit increases.

For example, referring to FIG. 8, when the overlapping length $L_o$ is greater than about 0.1 µm, the output current is nearly saturated. Accordingly, an overlapping length $L_o$ greater than about 0.1 µm efficiently and sufficiently increases the output voltage $V_o$.

Hereinafter, properties of first through third inverter devices according to example embodiments will be described in more detail.

Figure 2:
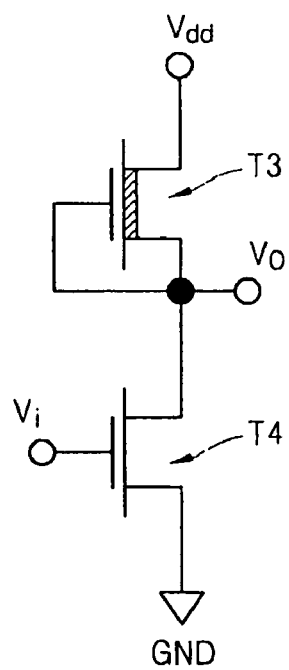
FIG. 2 is a circuit diagram illustrating a conventional enhancement/depletion (E/D)-mode inverter device.
Figure 9:
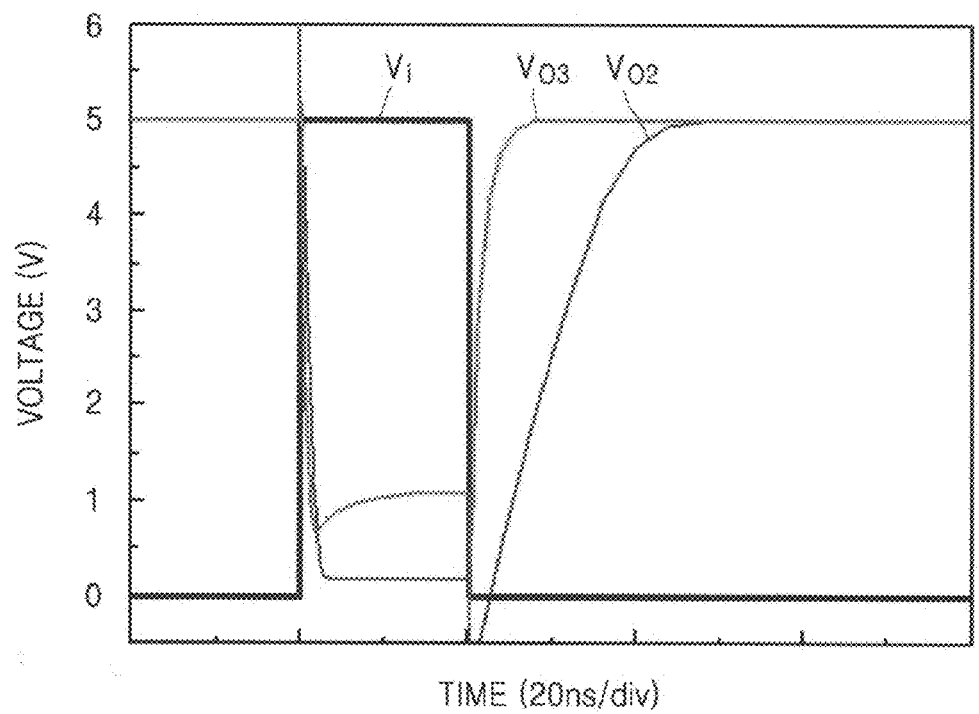
FIG. 9 is a graph illustrating a time-current property obtained by a simulation of the conventional (E/D)-mode inverter device of FIG. 2 and the example embodiment of the inverter device of FIG. 3.

FIG. 9 is a graph illustrating a time-current property obtained by a simulation of the conventional (E/D)-mode inverter device of FIG. 2 and the inverter device of FIG. 3.

Referring to FIG. 9, an output voltage $V_O$ of the inverter device of FIG. 3 and an output voltage $V_O$ of the conventional (E/D)-mode inverter device of FIG. 2 are compared with respect to an input voltage $V_i$, respectively. Hereinafter, an output voltage $V_O$ of the conventional (E/D)-mode inverter device of FIG. 2 is referred as 'output voltage $V_{O2}$' and an output voltage $V_O$ of the inverter device of FIG. 3 is referred as 'output voltage $V_{O3}$'.

As shown in FIG. 9, the output voltage $V_{O3}$ is about 5 V in a high level and is about 0.7 V in a low level, whereas the output voltage $V_{O2}$ is about 5 V in a high level and is about 0.17 V in a low level. A signal propagation time is about 0.75 ns for the output voltage $V_{O3}$, as compared to about 4.5 ns for the output voltage $V_{O2}$. Accordingly, the inverter device of FIG. 3 has a similar output in a high level, but reduced signal propagation time as compared to the conventional (E/D)-mode inverter device of FIG. 2.

Figure 10:
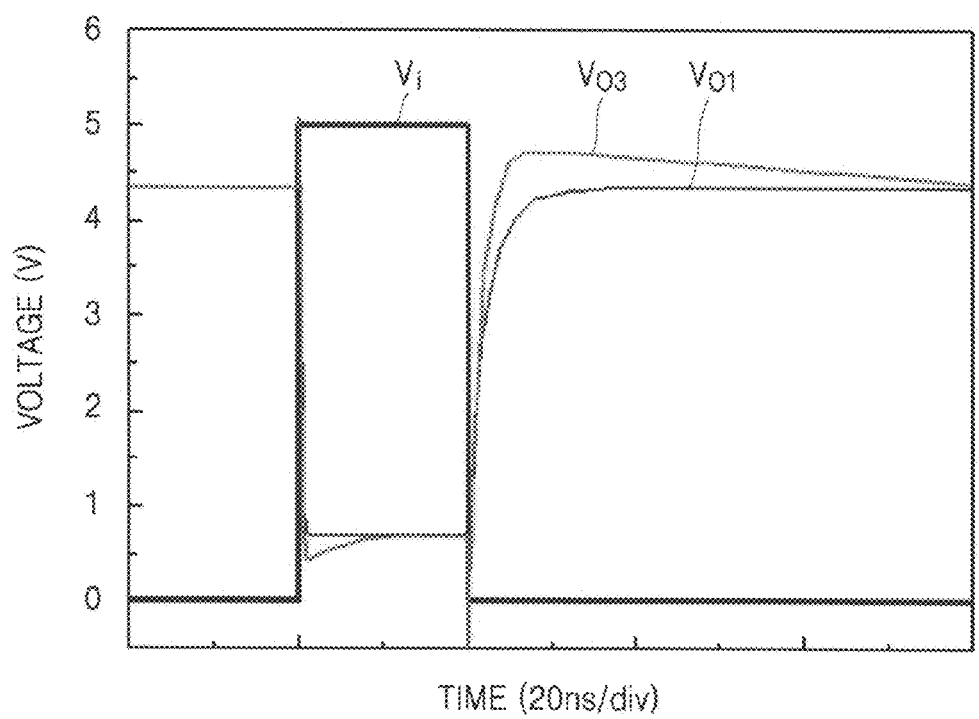
FIG. 10 is a graph illustrating a time-voltage property obtained by a simulation of the conventional (E/E)-mode inverter device of FIG. 1 and the example embodiment of the inverter device of FIG. 3.

FIG. 10 is a graph illustrating a time-voltage property obtained by a simulation of the conventional (E/E)-mode inverter device of FIG. 1 and the inverter device of FIG. 3.

Referring to FIG. 10, an output voltage $V_O$ of the inverter device of FIG. 3 and an output voltage $V_O$ of the conventional (E/E)-mode inverter device of FIG. 1 is compared with respect to an input voltage $V_i$, respectively. Hereinafter, an output voltage $V_O$ of the conventional (E/E)-mode inverter device of FIG. 1 is referred as 'output voltage $V_{O1}$'. The output voltage $V_O$ of the inverter device of FIG. 3 is again referred as 'output voltage $V_{O3}$'.

As shown in FIG. 10, the output voltage $V_{O3}$ is about 4.7 V in a high level and is about 0.43 V in a low level, whereas the output voltage $V_{O1}$ is about 4.3 V in a high level and is about 0.7 V in a low level. Moreover, a signal propagation time is about 1.6 ns for the output voltage $V_{O3}$, but about 1.7 ns for the output voltage $V_{O1}$. Accordingly, the inverter device of FIG. 3 has a similar signal propagation time, while having an increased output in a high level as compared to the conventional (E/E)-mode inverter device of FIG. 1.

Figure 11:
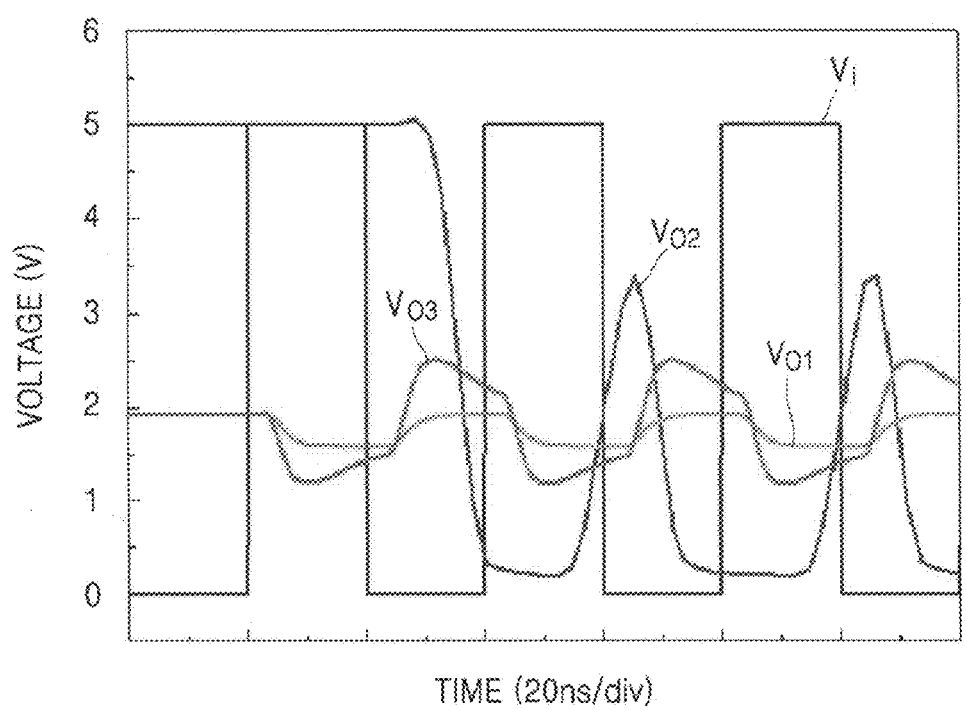
FIG. 11 is a graph illustrating a time-voltage property obtained by a simulation of a 7-level chain structure of the conventional (E/E)-mode inverter device of FIG. 1, the conventional (E/D)-mode inverter device of FIG. 2, and the example embodiment of the inverter device of FIG. 3.

FIG. 11 is a graph illustrating a time-voltage property obtained by a simulation of a 7-level chain structure of the conventional (E/E)-mode inverter device, the conventional (E/D)-mode inverter device, and the inverter device of FIGS. 1 through 3, respectively.

Referring to FIG. 11, an output voltage $V_{O3}$ of a chain of the inverter devices of FIG. 3, an output voltage $V_{O1}$ of a chain of the conventional (E/E)-mode inverter devices of FIG. 1, and an output voltage $V_{O2}$ of a chain of the conventional (E/D)-mode inverter devices of FIG. 2 are compared with an input voltage $V_i$. The output voltage $V_{O1}$ is about 1.9 V in a high level and is about 1.58 V in a low level, and has a signal propagation time of about 6 ns. The output voltage $V_{O2}$ is about 3.4 V in a high level and is about 0.21 V in a low level, and has a signal propagation time of about 38 ns. The output voltage $V_{O3}$ is about 2.5 V in a high level and is about 1.2 V in a low level, and has a signal propagation time of about 6 ns.

Accordingly, by using a chain structure of the inverter device shown in FIG. 3, a sufficiently high output in a high level may be obtained, while reducing signal propagation time.

Although example embodiments have been described with respect to inverter circuits, it will be understood that example embodiments (e.g., the transistors shown in FIGS. 5 and/or 6) may be implemented in any suitable logic circuit (e.g., AND, NAND, NOR, OR, EX-OR, etc.)

While the present invention has been particularly shown and described with reference to example embodiments thereof, it will be understood by one of ordinary skill in the art that various changes in form and details may be made therein without departing from the spirit and scope of the present invention as defined by the following claims.

What is claimed is:

1. An inverter device comprising:
at least a first transistor connected between a power source node and ground, the first transistor including a first gate and a first terminal that are capacitively-coupled internal to the first transistor to control a boost voltage at a boost node, the first terminal being one of a first source and a first drain of the first transistor; wherein
a plurality of transistors are connected between the power source node and ground, the plurality of transistors including,
the first transistor, wherein a power voltage is applied to the first drain,
a second transistor including a second gate, a second source, and a second drain, wherein an input voltage is applied to the second gate, and the second drain is connected to the first source at an output node through which an output voltage is output, and
a third transistor including a third gate, a third source, and a third drain, wherein the power voltage is applied to the third gate and the third drain, and the third source is connected to the first gate, and the first gate and the first source are internally capacitive-coupled in the first transistor to control the boost voltage at the boost node, and the third gate and the third source are internally capacitive-coupled by a first parasitic capacitance resulting from an overlap between the third gate and the third source.

2. The inverter device of claim 1, wherein the first gate and the first terminal are internally capacitive-coupled via a second parasitic capacitance.

3. The inverter device of claim 1, wherein the second parasitic capacitance is provided by an overlap between at least the first terminal and the first gate.

4. The inverter device of claim 1, wherein the boost voltage is controlled based on a channel width of the first transistor and an overlapping length between the first terminal and the first gate.

5. The inverter device of claim 1, wherein the boost voltage is controlled without using a separate capacitor.

6. The inverter device of claim 1, wherein the first gate and the first source are capacitive-coupled by a second parasitic capacitance resulting from an overlap between the first gate and the first source.

7. The inverter device of claim 6, wherein the first transistor is a thin film transistor.

8. The inverter device of claim 7, wherein the first transistor has an inverted structure in which the first source and the first drain are formed on the first gate.

9. The inverter device of claim 1, wherein an overlapping length between the first gate and the first source is greater than about 0.1 µm.

10. The inverter device of claim 1, wherein the third transistor is a thin film transistor.

11. The inverter device of claim 10, wherein the third transistor has an inverted structure in which the third source and the third drain are formed on the third gate.

12. The inverter device of claim 1, wherein the second source is connected to ground.

13. The inverter device of claim 1, wherein each of the first transistor, the second transistor, and the third transistor is an enhancement-mode transistor.

14. The inverter device of claim 1, wherein
the first transistor is a load transistor,
the second transistor is an input transistor, the second source of the input transistor being connected to ground, and
the third transistor is a pre-charge transistor, and wherein the first gate and the first source are internally capacitive-coupled by a first parasitic capacitance formed by the overlap between the first gate and the first source.

15. A method of operating an inverter device including at least a first transistor connected between a power source node and ground, the first transistor including a first gate and a first terminal that are capacitively-coupled internal to the first transistor to control a boost voltage at a boost node, the first terminal being one of a first source and a first drain of the first transistor, wherein a plurality of transistors are connected between the power source node and ground, and wherein the plurality of transistors include,
the first transistor, wherein a power voltage is applied to the first drain,
a second transistor including a second gate, a second source, and a second drain, wherein an input voltage is applied to the second gate, and the second drain is connected to the first source at an output node through which an output voltage is output, and
a third transistor including a third gate, a third source, and a third drain, wherein the power voltage is applied to the third gate and the third drain, and the third source is connected to the first gate, the method comprising:
controlling a size of the boost voltage by a first parasitic capacitance formed by the overlap between the first gate and the first terminal, the boost voltage being induced on the first gate of the first transistor; wherein
the size of the boost voltage is further controlled by a second parasitic capacitance resulting from an overlap between the third gate and the third source.

16. The method of claim 15, wherein the first parasitic capacitance is controlled by an overlapping area between the first gate and the first terminal.

17. The method of claim 16, wherein the overlapping area between the first gate and the first source is controlled by an overlapping length between the first gate and the first terminal.

18. The method of claim 16, wherein the overlapping area between the first gate and the first terminal is controlled by a channel width of the first transistor.

19. The method of claim 15, wherein the second parasitic capacitance is controlled by an overlapping area between the third gate and the third source.

20. The method of claim 19, wherein the overlapping area between the third gate and the third source is controlled by an overlapping length between the third gate and the third source.

21. The method of claim 19, wherein the overlapping area between the third gate and the third source is controlled by a channel width of the third transistor.

* * * * *